United States Patent [19]

Irving et al.

[11] Patent Number: 4,500,629
[45] Date of Patent: Feb. 19, 1985

[54] METHOD OF FORMING IMAGES FROM LIQUID MASSES

[75] Inventors: Edward Irving, Burwell; Terence J. Smith, Royston, both of England

[73] Assignee: Ciba-Geigy Corporation, Ardsley, N.Y.

[21] Appl. No.: 517,095

[22] Filed: Jul. 25, 1983

[30] Foreign Application Priority Data

Apr. 8, 1982 [GB] United Kingdom ............ 8222467

[51] Int. Cl.³ .............................................. G03C 5/00
[52] U.S. Cl. .................................. 430/325; 430/327; 430/935; 430/195; 430/196; 430/176; 430/311; 430/306; 430/281; 430/285; 430/286; 204/159.15
[58] Field of Search ............... 430/325, 195, 196, 327, 430/935, 176, 311, 306, 281, 285, 286; 204/159.14, 159.15, 159.16, 159.17

[56] References Cited

U.S. PATENT DOCUMENTS

| | | | |
|---|---|---|---|
| 2,895,950 | 7/1959 | Krieble | 260/475 |
| 3,221,043 | 11/1965 | Fekete et al. | 260/47 |
| 3,425,988 | 2/1969 | Gorman et al. | 260/47 |
| 3,549,583 | 12/1970 | Nagata et al. | 260/37 |
| 3,616,040 | 10/1971 | Toback | 156/310 |
| 3,632,854 | 1/1972 | Randall | 260/410.6 |
| 3,642,739 | 2/1972 | Van Gogh et al. | 260/86.3 |
| 3,657,117 | 4/1972 | Pfitzner et al. | 210/31 |
| 3,661,744 | 5/1972 | Kehr et al. | 204/159.14 |
| 3,697,619 | 10/1972 | Nagata et al. | 260/836 |
| 3,975,340 | 8/1976 | Manaka | 260/836 |
| 4,058,400 | 11/1977 | Crivello | 96/86 P |
| 4,058,401 | 11/1977 | Crivello | 96/115 R |
| 4,291,118 | 9/1981 | Boduch et al. | 430/313 |
| 4,299,938 | 11/1981 | Green et al. | 526/192 |
| 4,339,567 | 7/1982 | Green et al. | 528/102 |
| 4,383,025 | 5/1983 | Green et al. | 430/280 |

FOREIGN PATENT DOCUMENTS

| | | |
|---|---|---|
| 989201 | 4/1965 | United Kingdom . |
| 1006587 | 10/1965 | United Kingdom . |
| 1228479 | 4/1971 | United Kingdom . |
| 1235769 | 6/1971 | United Kingdom . |
| 1241851 | 8/1971 | United Kingdom . |

OTHER PUBLICATIONS

CA, 53, 18556c, (1959), (=AA).
Derwent, 24527B, (=JA 54/22445).
Derwent, 72533C, (=JA 55/112211).
Derwent, 44393E, (=JA 57/65712).

Primary Examiner—Won H. Louie
Attorney, Agent, or Firm—Luther A. R. Hall

[57] ABSTRACT

Images are prepared by a process in which a layer, supported on a substrate, of a liquid composition comprising
  (a) an anaerobically polymerizable material and
  (b) a photopolymerizable material is maintained in a substantially oxygen-free environment such that the composition solidifies. It is then exposed imagewise to actinic radiation and treated with a developer to remove parts of the layer which have not been struck by the radiation.

The anaerobically polymerizable and photopolymerizable materials may be a mixture of two or more materials having these different functions, such as an acrylate ester with an azido compound, or the two functions may be combined in a single molecule. The products are suitable for use in producing printing plates and printed circuits.

20 Claims, No Drawings

METHOD OF FORMING IMAGES FROM LIQUID MASSES

This invention relates to a method of forming images from liquid masses, particularly from liquid coatings on substrates, by exposing them to anaerobic conditions and then to actinic radiation.

Conventionally, production of an image by means of photopolymerisation is achieved by coating a support with a solution in a volatile organic solvent of a photopolymerisable substance, causing or allowing the solvent to evaporate so leaving a film of the photopolymerisable substance, irradiating the film with actinic radiation as through an image whereby the parts of the film struck by the irradiation become photopolymerised (and less soluble) while those parts shielded from the irradiation remain substantially unaffected, then dissolving away the unirradiated, unphotopolymerised parts of the film by means of a suitable solvent which does not dissolve the irradiated, photopolymerised parts. This last stage is conventionally known as "development".

It would be desirable to have a process in which a layer of a photopolymerisable substance were applied to a support and this layer were converted into a substantially solid, non-tacky state, ready for irradiation, without the use of organic solvents. Not only would, in this stage, the use be avoided of solvents which might present problems of toxicity and flammability and also cause expense in their recovery, but production on a continuous basis of coated supports, ready for irradiation, would be facilitated.

We have found that this object can be achieved by the use, in liquid form, of certain substances, or mixtures of substances, capable of undergoing both anaerobic curing and photopolymerisation. Removal of oxygen from a layer of such substances can cause solidification without affecting their ability to undergo photopolymerisation. When desired, parts of the composition may be subjected to actinic irradiation, causing those parts to photocrosslink and thus become much more resistant to solution in solvents.

United States Patent Specification No. 4,291,118 describes a method for forming relief images from a film of a liquid photopolymerisable material, comprising solidifying the film by chemical hardening, then exposing or re-exposing the solidified film to actinic radiation in the form of a pattern so that parts of the film become chemically differentiated, and then selectively removing the portions of the film not exposed to the patterned exposure to actinic radiation by washing with a solvent. The only method used for effecting solidification in all the embodiments described is exposure to actinic radiation, although the disclosure contains the remark "Heat could also by extension be used". The only photopolymerisable materials mentioned are mixtures of polyenes with polythiols. This method is not easy to carry out successfully. If the initial solidification is carried out by irradiation, great care must be taken to give the right amount of irradiation since, if too little is given, the liquid composition will not solidify and if too much is given it will not be possible to obtain a good image after the second irradiation. Furthermore, the reaction between the polyene and the polythiol, which is initiated on exposure to actinic radiation, continues when such exposure is interrupted. It follows that if images of good quality are to be obtained the imagewise exposure stage must be performed without delay. This is a further constraint on industrial utilisation of the process.

Although anaerobic solidification has been known for over 25 years, use of anaerobically polymerisable materials, alternatively referred to herein as anaerobically curable materials, has been restricted to adhesive bonding and sealing.

Compositions which are both anaerobically polymerisable and photopolymerisable are described in Japanese Patent Application Kokai No. 54-22445 (1979) (Derwent CPI Abstract No. 24527B) and Japanese Patent Application Kokai No. 55-112211 (1980) (Derwent CPI Abstract No. 72533C). When used in the bonding of nuts and bolts or other engaging parts, or in the sealing of cavities, the compositions are said to be applied to articles and cured both anaerobically and by the action of light, irradiation with light being carried out before, during or after anaerobic curing. It is indicated that when anaerobic curing is effected before irradiation, the only part of the composition which is not cured anaerobically is the surface, which is cured by the subsequent irradiation to complete formation of the bond or seal.

This invention provides a process for the production of an image which comprises (1) maintaining in a substantially oxygen-free environment a layer, supported on a substrate, of a liquid composition containing
 (a) an anaerobically polymerisable material and
 (b) a photopolymerisable material for a sufficient period for the said liquid composition to solidify,
(2) exposing imagewise to actinic radiation the said solidified layer, and
(3) treating the layer with a developer to remove those parts of the layer which have not been exposed to the actinic radiation in (2).

The expression "exposing imagewise" includes both exposure through an image-bearing transparency consisting of opaque and transparent parts and also subjecting to a laser beam moved in a predetermined pattern, for example as directed by a computer, so as to form an image.

The curable liquid compositions used in accordance with the present invention may comprise a mixture of one or more substances that are anaerobically-curable with one or more substances that are exclusively photopolymerisable. Alternatively, it may comprise one or more "dual-functional" substances, that is substances which are both anaerobically-curable and photopolymerisable, especially substances having in the same molecule one or more groups which are anaerobically curable and one or more groups which are exclusively photopolymerisable; in this embodiment materials (a) and (b) are the same. In a further alternative, the liquid composition may comprise a mixture of one or more such dual-functional substances with one or more anaerobically-curable substances and/or one or more exclusively photopolymerisable substances.

Anaerobically polymerisable materials are well known and many are commercially available. The anaerobically polymerisable materials used in accordance with this invention generally comprise (i) an ester of an acrylic acid, optionally containing free acidic or amino groups,
(ii) a polymerisation initiator for (i) and, if desired,
(iii) an accelerator for the polymerisation of (i).

Suitable esters of acrylic acids (i) include esters, especially acrylates and methacrylates, of monohydric alcohols, of polyhydric alcohols (full and partial esters), hydroxycarboxylic, hydroxysulphonic, and hydroxyphosphoric acids, and of hydroxyalkylamines and hydroxyalkylnitriles, and acrylic ester-urethanes and -ureides. Such esters are most commercially available and any that are not may be prepared by known esterification techniques.

Suitable esters of acrylic acids include those of formula

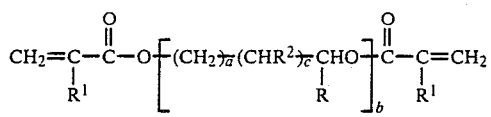

where
a is an integer of 1 to 8,
b is an integer of 1 to 20,
c is zero or 1,
R denotes —H, —CH$_3$, —C$_2$H$_5$, —CH$_2$OH or

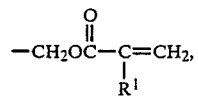

R$^1$ denotes —H, —Cl, —CH$_3$, or —C$_2$H$_5$, and
R$^2$ denotes —H, —OH, or

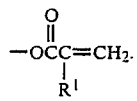

Preferred among such compounds are those of formula I where a is from 1 to 4, b is from 1 to 5, and R$^1$ denotes —H or —CH$_3$. Compounds of formula I where b is 2 or more are described in U.S. Pat. No. 2,895,950.

Other suitable esters are of formula

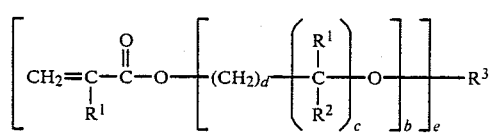

where
b, c, R$^1$, and R$^2$ have the meanings assigned above,
d is zero or a positive integer, provided that c and d are not both zero,
e is 1, 2, 3, or 4,
and R$^3$ denotes an organic radical of valency e linked through a carbon atom or carbon atoms thereof to the indicated b oxygen atoms.

Preferred among such compounds are those where, in formula II, b, c, and d are each 1, R$^1$ is —H or —CH$_3$, and R$^3$ is the hydrocarbon residue of an aliphatic alcohol containing from 1 to 6 carbon atoms, such as —CH$_3$ or

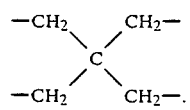

Compounds of formula II are described in United Kingdom Patent Specification No. 1,228,479.

Yet other suitable esters are those of formula

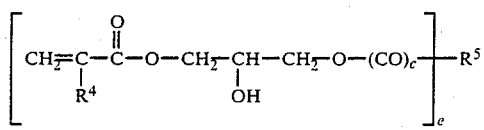

where
c and e have the meanings previously assigned,
R$^4$ denotes —H or —CH$_3$, and
R$^5$ denotes an organic radical of valency e, linked through a carbon atom thereof other than the carbon atom of a carbonyl group.

More particularly, when c is zero, R$^5$ may denote the residue, containing from 1 to 18 carbon atoms, of an alcohol or phenol having e hydroxyl groups.

R$^5$ may thus represent
an aromatic, araliphatic, alkaromatic, cycloaliphatic, heterocyclic, or heterocycloaliphatic group, such as an aromatic group containing only one benzene ring, optionally substituted by chlorine or by alkyl groups each of from 1 to 9 carbon atoms, or an aromatic group comprising a chain of two to four benzene rings, optionally interrupted by ether oxygen atoms, aliphatic hydrocarbon groups of 1 to 4 carbon atoms, or sulphone groups, each benzene ring being optionally substituted by chlorine or by alkyl groups each of from 1 to 9 carbon atoms, or, preferably, a saturated or unsaturated, straight or branched-chain aliphatic group, which may contain ether oxygen linkages and which may be substituted by hydroxyl groups, especially a saturated or monoethylenically-unsaturated straight chain aliphatic hydrocarbon group of from 1 to 8 carbon atoms.

Specific examples of such groups are the aromatic groups of the formulae —C$_6$H$_5$ and —C$_6$H$_4$CH$_3$, in which e is 1, —C$_6$H$_4$C(CH$_3$)$_2$C$_6$H$_4$—, and —C$_6$H$_4$CH$_2$C$_6$H$_4$—, in which case e is 2, and

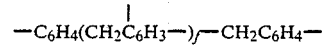

where f is 1 or 2, in which case e is 3 or 4, and the aliphatic groups of formula

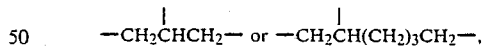

in which case e is 3, of formula —(CH$_2$)$_4$—, —CH$_2$CH=CHCH$_2$—, —CH$_2$CH$_2$OCH$_2$CH$_2$—, or —(CH$_2$CH$_2$O)$_2$CH$_2$CH$_2$—, in which case e is 2, or of the formula —(CH$_2$)$_3$CH$_3$, —(CH$_2$)$_4$OH, —CH$_2$CH=CH$_2$, or —CH$_2$CH=CHCH$_2$OH, in which case e is 1.

When c is 1, R$^5$ may represent the residue, containing from 1 to 60 carbon atoms, of an acid having e carboxyl groups, preferably
a saturated or ethylenically-unsaturated, straight chain or branched aliphatic hydrocarbon group of from 1 to 20 carbon atoms, which may be substituted by chlorine atoms and which may be interrupted by ether oxygen atoms and/or by carbonyloxy (—COO—) groups, or
a saturated or ethylenically-unsaturated cycloaliphatic or aliphatic-cycloaliphatic hydrocarbon group of at least 4 carbon atoms, which may be substituted by chlorine atoms, or an aromatic hydrocarbon group of from 6 to 12 carbon atoms, which may be substituted by chlorine atoms.

Further preferred are such compounds in which $R^5$ represents a saturated or ethylenically-unsaturated straight chain or branched aliphatic hydrocarbon group of from 1 to 8 carbon atoms, optionally substituted by a hydroxyl group, or a saturated or ethylenically-unsaturated straight chain or branched aliphatic hydrocarbon group of from 4 to 50 carbon atoms and interrupted in the chain by carbonyloxy groups, or a saturated or ethylenically-unsaturated monocyclic or bicyclic cycloaliphatic hydrocarbon group of 6 to 8 carbon atoms, or an ethylenically-unsaturated cycloaliphatic-aliphatic hydrocarbon group of from 10 to 51 carbon atoms, or a mononuclear aromatic hydrocarbon group of from 6 to 8 carbon atoms.

Specific examples of these residues of carboxylic acids are those of the formula —CH₃, —CH₂CH₃, —CH₂CH(OH)CH₃, —CH₂Cl, and —C₆H₅, in which case e is 1, and —CH₂CH₂—, —CH=CH—, and —C₆H₄—, in which case e is 2.

Compounds of the general formula III are described in United Kingdom Patent Specifications Nos. 989,201, 1,006,587, 1,235,769, and 1,241,851, and U.S. Pat. Nos. 3,221,043, 3,549,583, 3,632,854, 3,642,739, 3,657,117, and 3,697,619.

Still other suitable esters are acrylate-urethanes and acrylate-ureides of formula

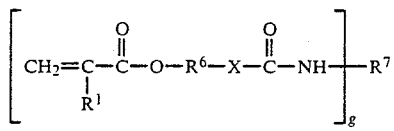

IV where $R^1$ has the meaning assigned above, $R^6$ denotes a divalent aliphatic, cycloaliphatic, aromatic, or araliphatic group, bound through a carbon atom or carbon atoms thereof to the indicated —O— atom and —X— atom or group, X denotes —O—, —NH—, or —N(alkyl)—, in which the alkyl radical has from 1 to 8 carbon atoms, g is an integer of at least 2 and at most 6, and $R^7$ denotes a g-valent cycloaliphatic, aromatic, or araliphatic group bound through a carbon atom or carbon atoms thereof to the indicated NH groups.

Preferably $R^6$ denotes a divalent aliphatic group of 2 to 6 carbon atoms and $R^7$ denotes one of the following:

a divalent aliphatic group of 2 to 10 carbon atoms, such as a group of formula

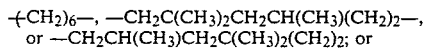

a phenylene group, optionally substituted by a methyl group or a chlorine atom; a naphthylene group; a group of formula

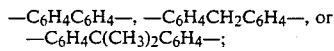

or a mononuclear alkylcycloalkylene or alkylcycloalkylalkylene group of from 6 to 10 carbon atoms, such as a methylcyclohex-2,4-ylene, methylcyclohex-2,6-ylene, or 1,3,3-trimethylcyclohex-5-ylenemethyl group.

Compounds of the general formula IV are described in U.S. Pat. No. 3,425,988.

Yet other suitable acrylates are those of formula

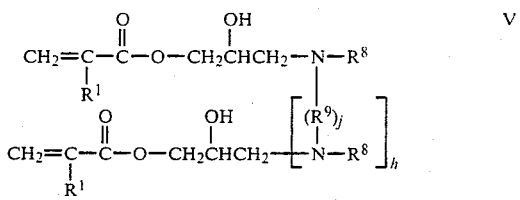

V where each $R^1$ has the remaining previously assigned, each $R^8$ denotes —H or an alkyl radical of 1 to 6 carbon atoms, optionally substituted by a cyano or hydroxyl group or by a group of formula

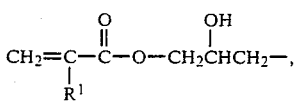

each $R^9$ is a divalent aliphatic, aromatic, heterocyclic or cycloaliphatic residue of 1 to 10 carbon atoms, linking through carbon atoms thereof the indicated nitrogen atoms, h is zero or an integer of from 1 to 3, and is not less than j, j is zero or 1, and is 1 when h is 2 or 3.

Preferably $R^8$ denotes an isopropyl group and preferably $R^9$ denotes an ethylene, propylene, or p-phenylene group.

A specific example of a compound of the general formula V is that of formula

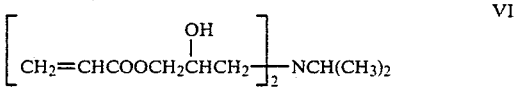

VI

Compounds of the general formula V are described in United Kingdon Patent Specification No. 1,339,017.

Typical polyfunctional acrylic esters useful as (i) are the acrylates and methacrylates of ethylene glycol, butane-1,4-diol, neopentyl glycol, diethylene glycol, dipropylene glycol, triethylene glycol, tripropylene glycol, trimethylolpropane, pentaerythritol, 1,4-bis(2-hydroxy-3-methacryloyloxypropoxy)-butane, poly(2-hydroxy-3-(methacryloyloxy)propyl)ethers of bisphenols and phenol-formaldehyde novolaks, 2,4-bis(2-methacryloyloxyethoxycarbonamido)toluene, 2,6-bis(2-methacryloyloxyethoxycarbonamido)toluene.

Preferred esters (i) are those having only one acrylic ester, especially acrylate or methacrylate, group per molecule. These include acrylate and methacrylate esters of saturated or unsaturated monohydric alcohols which may be aliphatic alcohols such as 2-methoxyethanol or allyl alcohol, cycloaliphatic alcohols such as cyclohexanol or dicyclopentenyl alcohol, heterocyclic aliphatic alcohols such as furfuryl alcohol or tetrahydrofurfuryl alcohol, or araliphatic alcohols such as benzyl alcohol. Also included are esters of formula III where e is 1, for example, 2-hydroxy-3-methacryloyloxypropoxybenzene and 2-hydroxy-3-acryloyloxypropoxybenzene, and partial esters of polyhydric alcohols, which may be prepared by esterifying the alcohol or by reacting a 1,2-alkylene oxide with acrylic or methacrylic acid, for example polyethylene glycol monomethacrylate having 5 to 20 ethylene oxide units, polypropylene glycol monomethacrylate having 5 or 6 propylene oxide units, 2-hydroxyethyl methacrylate and 2-hydroxypropyl acrylate. Other suitable esters are esters of polyhydric alcohols in which one alcoholic hydroxyl group is substituted by an acryloyloxy or methacryloyloxy group and the remaining alcoholic hydroxyl group or groups are substituted by other acyloxy groups, which may, for instance, be metal-chelating groups, for example, acetoacetoxyethyl methacrylate. Further suitable esters are acrylates and methacrylates of hydroxycarboxylic acids such as glycolic acid or dimerised acrylic acid (3-hydroxypropionic acid), hydroxysulphuric acids such as 2-hydroxyethanesulfonic acid, hydroxyphosphoric acids such as 2-hydroxyethyl dihydrogen phosphate, hydroxyalkylamines such as 2-(diethylamino)ethanol and hydroxyalkylnitriles such as 2-cyanoethanol and ester-urethanes such as 2-methacryloyloxyethoxycarbonamidobenzene.

Polymerisation initiators or catalysts which may be used in accordance with the invention include hydroperoxides, peroxides, α-hydroxysulphones, aromatic α-aminosulphones and mixtures of an organic amine oxide and a HN= acidic compound such as a sulphonic or carboxylic acid hydrazide, sulphimide, disulphonyl imide or acyl cyanamide. Hydroperoxides, peroxides and mixtures of an amine oxide and a sulphonic acid hydrazide are preferred polymerisation initiators. Organic hydroperoxides which may be used include those of formula $R^{10}OOH$, where $R^{10}$ is a monovalent organic radical containing up to 18 carbon atoms, especially an alkyl, aryl, or aralkyl radical containing from 4 to 13 carbon atoms. Typical hydroperoxides are ethyl methyl ketone hydroperoxide, tert.butyl hydroperoxide, cumene hydroperoxide, and hydroperoxides formed by the oxygenation of cetene or cyclohexene, tert.butyl hydroperoxide and cumene hydroperoxide being especially effective. Hydrogen peroxide may also be employed. A range of organic peroxides may be used, such as 2,5-dimethyl-2,5-di(tert.butylperoxy)hexane, di-tert.butyl peroxide, dihexylene glycol peroxide, tert.butyl cumyl peroxide, isobutyl methyl ketone peroxide, and also peresters such as tert.butyl peracetate, tert.butyl perbenzoate, and tert.butyl perphthalate. Preferred amine oxides, which can also be used as their salts, are oxides of aromatic tertiary amines such as N,N-dimethyl-p-toluidine and N,N-dimethylaniline. Preferred hydrazides are those of aromatic sulphonic acids such as benzenesulphonic acid and p-toluenesulphonic acid.

Suitable accelerators (iii) include aliphatic amines having at least two primary aliphatic amino groups and their ketimines, such as diethylenetriamine or triethylenetetramine and their ketimines with isobutyl methyl ketone; polyisocyanates, such as toluene-2,4-di-isocyanate; aldimines, tertiary amines, such as N,N-dimethylbenzylamine and triethylamine; imides and sulphimides, such as o-benzoic sulphimide; dithiocarbamates; amides and thioamides such as formamide; thiazoles such as 2-mercaptobenzthiazole; ascorbic acid; organic phosphites; quaternary ammonium salts and bases; salts of transition metals; thioureas; and polymercaptans, especially esters of mercaptan-carboxylic acids, such as glycerol tris(thioglycollate). In a particularly preferred embodiment, the accelerator is a mixture of a sulphimide such as o-benzoic sulphimide and an aromatic tertiary amine such as N,N-dimethyl-p-toluidine.

The amount of polymerisation initiator (ii) may vary between 0.01% and 15% by weight of the ester (i), quantities of from 1% to 10% by weight generally being used. The amount of accelerator (iii) used is also preferably from 1 to 10% by weight of the ester (i).

Exclusively photopolymerisable materials (b) which may be used in accordance with the present invention may be those in which polymerisation is effected by direct activation of photosensitive groups through radiation or those in which the radiation activates a suitable photoinitiator molecule which then activates polymerisable groups.

Materials having photosensitive groups are well known and include those having at least two, and preferably three or more, groups which are azido, coumarin, stilbene, maleimido, pyridinone, chalcone, propenone, pentadienone, or acrylic acid groups which are substituted in their 3-position by a group having ethylenic unsaturation or aromaticity in conjugation with the ethylenic double bond of the acrylic group.

Materials in which photopolymerisation is effected by activation of a photoinitiator which then activates polymerisable groups include epoxide resins, phenolic resins, urea-formaldehyde resins, cyclic ethers, cyclic esters, cyclic sulphides, cyclic amines and organosilicon cyclics in combination with a radiation-sensitive aromatic 'onium salt, such as diazonium, sulphonium, iodonium, and sulphoxonium salts.

Examples of suitable azides are those containing at least two groups of formula $$N_3Ar— \qquad \text{VII}$$

where Ar denotes a mononuclear or dinuclear divalent aromatic radical containing in all from 6 to at most 14 carbon atoms, especially a phenylene or naphthylene group.

Examples of suitable coumarins are those containing groups of the formula

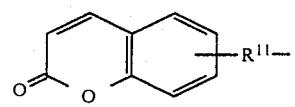
VIII where $R^{11}$ is an oxygen atom, a carbonyloxy group (—COO—), a sulphonyl group, or a sulphonyloxy group.

Examples of those containing stilbene groups are those containing groups of the formula

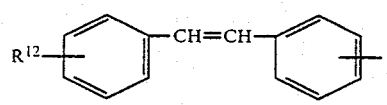
IX where $R^{12}$ is the residue, containing up to 8 carbon atoms in all, of a five or six-membered nitrogen-containing heterocyclic ring, fused to a benzene or naphthalene nucleus, and linked through a carbon atom of the said heterocyclic ring adjacent to a nitrogen hetero atom thereof to the indicated benzene nucleus, such as a benzimidazolyl, benzoxazolyl, benzotriazolyl, benzothiazolyl, or a naphthotriazolyl residue.

Examples of those containing maleimide units are those having groups of the formula

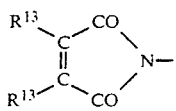

where each $R^{13}$ is an alkyl group of 1 to 4 carbon atoms, a chlorine atom, or a phenyl group, and especially a methyl group.

Examples of those containing pyridinone units are those having groups of the formula

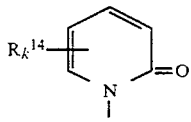

where
$R^{14}$ is an aliphatic or cycloaliphatic radical of 1 to 8 carbon atoms and
k is zero or an integer of 1 to 4.

Examples of compounds containing chalcone, propenone, and pentadienone groups are those containing groups of formula

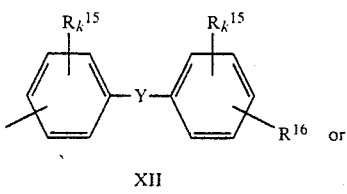

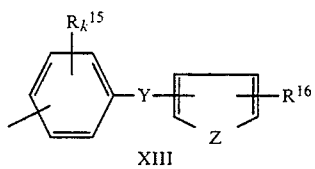

where
each $R^{15}$ is a halogen atom, or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing 1 to 9 carbon atoms, or is a nitro group, or a carboxyl, sulphonic, or phosphoric acid group in the form of a salt,
k has the meaning previously assigned,
$R^{16}$ represents a valency bond or a hydrogen atom,
Y represents a grouping of formula

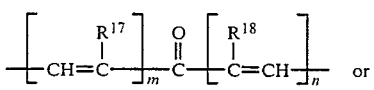

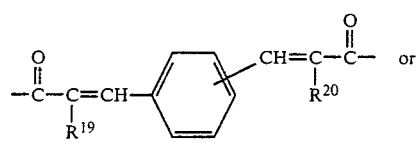

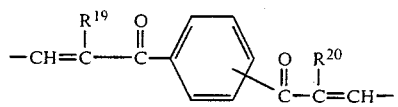

$R^{17}$ and $R^{18}$ are each individually a hydrogen atom, an alkyl group, e.g., of 1 to 4 carbon atoms, or an aryl group, preferably a mononuclear group such as a phenyl group, or $R^{17}$ and $R^{18}$ conjointly denote a polymethylene chain of 2 to 4 methylene groups, $R^{19}$ and $R^{20}$ are each a hydrogen atom, an alkyl group, e.g., of 1 to 4 carbon atoms, or an aryl group which is preferably a mononuclear group such as a phenyl group, m and n are each zero, 1, or 2, with the proviso that they are not both zero, and Z is an oxygen or sulphur atom.

Suitable 3-substituted acrylates contain groups of the general formula

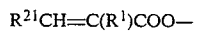

where
$R^{21}$ is an aliphatic or mononuclear aromatic, araliphatic, or heterocyclic group which, as already indicated, has ethylenic unsaturation or aromaticity in conjugation with the ethylenic double bond shown, such as phenyl, 2-furyl, 2- or 3-pyridyl, prop-2-enyl, or styryl group, and
$R^1$ has the meaning previously assigned.

Specific examples of disorbates of poly(oxyalkylene) glycols, polyvinyl cinnamate, and epoxide resin-cinnamic acid products.

Onium salts which, when combined with an epoxide resin or other cationically-polymerisable substances, give photopolymerisable mixtures, are described in U.S. Pat. Nos. 4,058,400 and 4,058,401. Suitable sulphoxonium salts that may be used for the same purpose are disclosed in U.S. Pat. No. 4,299,938, and in European Patent Applications Nos. 35969 and 44274.

Suitable dual-functional materials which may be used in the process of the present invention contain one or more acrylic ester groups which will polymerise under the anaerobic conditions used to polymerise the anaerobically-curing materials, and also one or more groups, as previously described, which will polymerise when irradiated or when activated by an irradiated molecule. Preferred materials are those containing one or more acrylic ester groups and one or more groups of formula X, XII or XIII, or one or more epoxide groups. Dual-functional materials may be made by introducing one or more acrylic ester groups into a compound which already contains one or more photopolymerisable groups and also one or more reactive groups such as carboxylic acid, phenolic or alcoholic hydroxy, epoxide, or imido groups.

Examples of classes of compounds containing a photopolymerisable group and also a carboxylic acid group are azidoaromatic acids; carboxyl-substituted stilbene derivatives such as stilbenebenzimidazoles, stilbenebenzoxazoles, stilbenebenzotriazoles, stilbenenaphthotriazoles, and stilbenebenzothiazoles; carboxyl-containing maleimides, where the two ethylenic carbon atoms of the maleimide ring are substituted by alkyl groups of 1 to 4 carbon atoms, phenyl groups, or chlorine atoms; and also acrylic acids substituted in the 3-position by groups having ethylenic unsaturation or aromaticity in conjugation with the ethylenic bond in the 2,3-position.

Examples of classes of compound containing a photopolymerisable group and also a phenolic hydroxyl group are hydroxy-substituted chalcones and hydroxyphenyl-substituted propenones and pentadienones. Examples of classes of compounds containing a photopolymerisable group and also an alcoholic hydroxyl group are hydroxy-substituted maleimides and hydroxy-substituted pyridinones. Such hydroxyl group-containing compounds may be reacted directly with an acrylic acid or acylating derivative thereof or they may first be converted into their glycidyl ethers, and these ethers then reacted with an acrylic acid or hydroxy-substituted ester thereof.

Examples of classes of compounds containing a photopolymerisable group and an imido group are disubstituted maleimides, where the two ethylenic carbon atoms of the maleimide ring are substituted as specified above.

Suitable azidoaromatic acids are 4-azidobenzoic acid and other compounds of formula

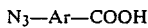

$$N_3-Ar-COOH \qquad XVIII$$

where Ar has the meaning previously assigned.

Suitable carboxyl-containing stilbene derivatives are 4-(1-methylbenzimidazol-2-yl)stilbene-4'-carboxylic acid, 4-(2H-naptho[1,2-d]triazol-2-yl)-stilbene-4'-carboxylic acid, and other compounds of the general formula

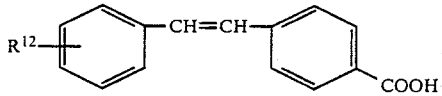

XIX where $R^{12}$ has the meaning previously assigned.

Suitable carboxyl-containing maleimides are N-(carboxyphenyl)dimethylmaleimide and other compounds of the general formula

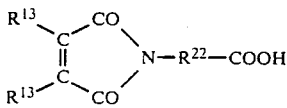

XX where
each $R^{13}$ has the meaning previously assigned and
$R^{22}$ denotes the residue, containing up to 14 carbon atoms, of an aromatic, aliphatic, or cycloaliphatic aminocarboxylic acid after removal of a primary amino group and a carboxylic acid group.

Suitable hydroxy-substituted chalcones and hydroxyphenyl-substituted propenones and pentadienones are 1-(4-hydroxyphenyl)-3-oxo-3-phenylprop-1-ene, 1-(4-hydroxyphenyl)-1-oxo-3-phenylprop-2-ene, 1-(2-furyl)-3-oxo-3-(4-hydroxyphenyl)prop-1-ene, and other compounds of the general formula

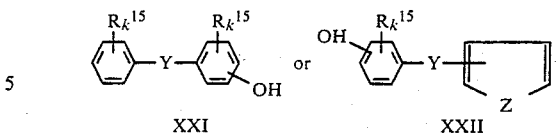

XXI  XXII where each $R^{15}$, k, Y, and Z have the meanings previously assigned.

Suitable hydroxy-substituted maleimides and hydroxy-substituted pyridinones are N-(2-hydroxyethyl)-dimethylmaleimide, 4,6-dimethyl-1-(2-hydroxyethyl)-pyridin-2-one, and other compounds of the general formula

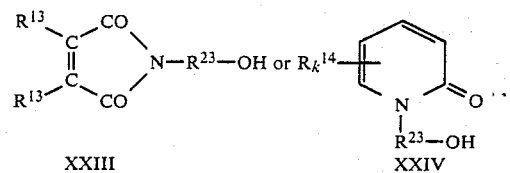

XXIII  XXIV where
each $R^{13}$, $R^{14}$, and k have the meaning previously assigned and
$R^{23}$ denotes the residue, of not more than 8 carbon atoms, of an aliphatic or cycloaliphatic aminoalcohol after removal of an amino group and an alcoholic hydroxyl group.

Suitable imides are dimethylmaleimide and other compounds of the general formula

XXV where each $R^{13}$ has the meaning previously assigned.
Suitable 3-substituted acrylic acids are of formula $$R^{21}CH=C(R^1)COOH \qquad XXVI$$

where $R^1$ and $R^{21}$ have the meanings previously assigned.

The acrylic group or groups may be introduced into such compounds by known methods, for example by esterification using an acrylic acid or a reactive derivative of an acrylic acid, or an acryloyl group-containing alcohol such as hydroxyethyl methacrylate.

Further substances which, in the presence of a radiation-sensitive aromatic 'onium salt, may be used as dual-functional materials are those containing both an epoxide group and an acrylic ester group, preferably those of formula

XXVII

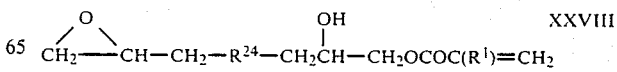

XXVIII and

-continued

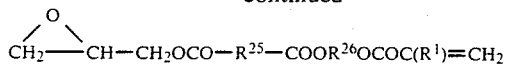
(XXIX)

where
- $R^1$ is as hereinbefore defined,
- $R^{24}$ represents the residue of a polyglycidyl compound after the removal of two glycidyl groups,
- $R^{25}$ represents the residue of a polycarboxylic acid after the removal of two carboxylic acid groups, and
- $R^{26}$ represents an alkylene chain of from 1 to 6 carbon atoms.

Suitable such residues $R^{24}$ include dihydric phenol, especially bisphenol, residues after removal of the two phenolic hydrogen atoms, glycol residues after removal of the two alcoholic hydrogen atoms, and hydantoin residues after removal of the two amidic hydrogen atoms. Suitable residues $R^{25}$ are saturated or unsaturated aliphatic or aromatic dicarboxylic acid residues and aromatic tri- or tetracarboxylic acid residues, after removal of two carboxylic acid groups, such as succinic, malonic, maleic, phthalic, trimellitic and pyromellitic acid residues. Suitable alkylene groups $R^{26}$ are ethylene, propylene, and butylene groups.

It will be apparent that these compounds fall within the definition of compounds already suggested above for use as anaerobically polymerisable materials. In the absence of a radiation-sensitive cationic catalyst such as an aromatic 'onium salt, the epoxide groups of such compounds are not photopolymerisable.

Suitable compounds of formula XXVII to XXIX may be made by introducing a group $-OCOC(R^1)=CH_2$ into a compound which already contains one or more 1,2-epoxide groups or, conversely, by introducing one or more 1,2-epoxide groups into a compound that already contains one or more groups of formula $-OCOC(R^1)=CH_2$.

A convenient method of introducing a group $-OCOC(R^1)=CH_2$ into a compound that already contains epoxide groups to produce, for example, a compound of formula XXVIII comprises reaction of an at least diepoxide with a stoichiometric deficit, based on the epoxide group content, of a compound containing both a group $-OCOC(R^1)=CH_2$ and also a group, such as a carboxylic acid, phenolic or alcoholic hydroxyl, or imido group, capable of reaction with a 1,2-epoxide group so as to introduce at least one acrylic ester group into the molecule. Suitable polyepoxides include polyglycidyl esters of polycarboxylic acids such as succinic acid, polyglycidyl ethers of polyhydric alcohols such as butane-1,4-diol and polyhydric phenols such as 2,2-bis(4-hydroxyphenyl)propane and poly(N-glycidyl) compounds such as N,N'-diglycidylhydantoins. It will be understood that this method will not usually give rise to a 100% yield of material containing, on the same molecule, both a 1,2-epoxide group and an acrylic group. The other material in the product comprises a mixture of unchanged starting material containing the original number of epoxide groups, and material in which all epoxide groups have been replaced by acrylic ester groups. However, since such mixtures may be successfully used in the present process, the fact that the reaction product is a mixture is of no consequence.

A convenient method of introducing one or more epoxide groups into a compound having at least one group $-OCOC(R^1)=CH_2$ to produce, for example, a compound of formula XXVII, comprises using as the former a compound which has also at least one alcoholic hydroxyl, or a carboxyl, group, and treating it such that the group or groups is or are converted into 1,2-epoxide groups, using methods known in the art of epoxide resins for converting hydroxyl or carboxyl groups into glycidyl ether or ester groups. For example, the compound is caused to react with epichlorohydrin in the presence of a hydrogen chloride acceptor (usually a strong base, e.g., NaOH) and preferably of a catalyst such as a quaternary ammonium compound, a tertiary amine, a transition metal salt, a thioether, or a sulphonium salt. Usually an excess of epichlorohydrin over the theoretical quantity required is employed, the excess serving as solvent for the reaction, which is normally carried out at a temperature of 30° to 120° C., preferably 40° to 65° C., and usually under reduced pressure in order to remove the water formed during the reaction.

A convenient method of making compounds such as those of formula XXIX comprises converting a hydroxy-substituted compound containing a group $-OCOC(R^1)=CH_2$ into a partial ester by reaction with a polycarboxylic acid anhydride. The free carboxylic acid group(s) may then be glycidylated, following the method outlined above, or may be esterified by treatment with a compound containing two or more epoxide groups, usually at 60° to 120° C. in the presence of a strong base and a catalyst such as a quaternary ammonium compound, or a transition metal salt.

Typical compounds of formulae XXVII to XXIX are glycidyl acrylate, glycidyl methacrylate, 2-(4-glycidyloxyphenyl)-2-(4-(3-acryloyloxy-2-hydroxypropoxy)phenyl)propane, 2-(4-(glycidyloxyphenyl)-2-(4-(2-hydroxy-3-methacryloyloxy)propoxy)phenyl)propane, 1-(2-methacryloyloxyethoxycarbonyl)-2,4- and 2,5-bis(glycidyloxycarbonyl)benzene, 1-(2-acryloyloxyethoxycarbonyl)-2,4- and 2,5-bis(glycidyloxycarbonyl)benzene, 2-acryloyloxyethoxy glycidyl succinate, 2-methacryloyloxyethoxy glycidyl succinate, 1-glycidyl-3-(3-acryloyloxy-2-hydroxypropyl)-5,5-dimethylhydantoin, 1-glycidyl-3-(2-hydroxy-3-methacryloyloxypropyl)-5,5-dimethylhydantoin, 1-glycidyloxy-4-(3-acryloyloxy-2-hydroxypropyloxy)-butane, and 1-glycidyloxy-4-(2-hydroxy-3-methacryloyloxypropyloxy)-butane.

Photopolymerisation may be effected by radiation in the presence of a photosensitiser such as 5-nitroacenaphthene, 4-nitroaniline, 2,4,7-trinitro-9-fluorenone, 3-methyl-1,3-diaza-1,6-benzanthrone, bis(dialkylamino)benzophenones, especially Michler's ketone, i.e., bis(p-dimethylamino)benzophenone, and 2-chlorothioxanthone.

Generally 0.1 to 20%, and preferably 0.5 to 15%, by weight of the photosensitiser is incorporated, based on the weight of photopolymerisable substance.

Compositions used in accordance with the present invention may also contain various additives, such as inhibitors to prevent premature polymerisation, diluents, and thickeners. Typical inhibitors are quinones or hydroquinones, which may be employed in quantities of 0.001 to 0.1% by weight of the anaerobically-curing component (a).

Incorporation into the composition of an acrylic acid has been found to give a product which is easily developed by treatment with aqueous alkali. The preferred addition rate for such acids is 0.5 to 5.0% by weight, calculated on the total weight of the composition.

The compositions are stable for prolonged periods in the presence of a sufficient quantity of oxygen but cure when oxygen is excluded. They are therefore best stored in containers that have an adequate airspace therein and/or are permeable to air.

In the photopolymerising step actinic radiation of wavelength 200–600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The time required for the exposure of the solidified layer will depend upon a variety of factors which include, for example, the individual photopolymerisable material used, the proportion of that material in the composition, the type of light source, and its distance from the composition. Suitable times may be readily determined by those familiar with photopolymerisation techniques.

The compositions of this invention may be applied as a liquid to a substrate such as steel, aluminium, copper, cadmium, zinc, paper, plastics, or wood. If desired, when the substrate is other than a transition metal, it may be 'activated' by treatment with a mixture of a condensation product of an aldehyde with a primary or secondary amine and a sulphur-containing free-radical accelerator, or by treatment with a compound containing an oxidisable transition metal. Details of such activation processes are given in U.S. Pat. No. 3,616,040.

After the coating has been applied to the substrate oxygen is removed, for example by evacuation or by replacement with an oxygen-free gas such as moist or dry nitrogen. After the coating has anaerobically solidified it is irradiated. By exposing part or parts of the coating to irradiation through a mask, those sections which have not been cured may be washed away with a solvent such as cyclohexanone, 2-ethoxyethanol, toluene, acetone, and mixtures thereof and aqueous solvents such as dilute aqueous sodium carbonate or sodium hydroxide. Thus, the compositions of this invention may be used in the production of printing plates and printing circuits. Methods of producing printing plates and printed circuits from photopolymerisable compositions are well known.

The following Examples illustrate the invention. All parts are by weight.

Materials used in the Examples are prepared as follows:

1-(p-(2-Hydroxy-3-methacryloyloxypropoxy)phenyl)-5-phenylpenta-1,4-dien-3-one

1-Phenylbut-1-en-3-one (58.4 g), and p-hydroxybenzaldehyde (48.8 g) are dissolved in ethanol (300 ml) and cooled to a temperature below 15° C., using an ice bath. A solution of sodium hydroxide (20 g) in water (80 ml) is added over 2 hours, the temperature of the mixture being kept below 15° C. This solution is then neutralised to pH 7 with dilute hydrochloric acid. An oily solid separates out, and this is filtered and washed with toluene to give 30.5 g of 1-(p-hydroxyphenyl)-5-phenylpenta-1,4-dien-3-one.

This product (25 g) is added, over 30 minutes, to a mixture heated at 80° C. of glycidyl methacrylate (14.3 g), tetramethylammonium chloride (0.12 g), and 2,6-ditertiary butyl-4-methylphenol (0.08 g). The mixture is heated for a further 4½ hours at 80° C., by which time the epoxide content has fallen to 0.24 equiv./kg. The mixture is cooled to give the desired product (39 g) which solidifies on standing.

Resin Solution I 1,5-Bis(4-glycidyloxyphenyl)penta-1,4-dien-3-one (100 parts) is mixed with 2,2-bis(3,5-dibromo-4-hydroxyphenyl)propane (38.2 parts), 2,2-bis(4-hydroxyphenyl)propane (27.3 parts), tetraethylammonium bromide (0.05 part), and 2-hydroxyethyl methacrylate (166 parts). This mixture is heated at 100° C. for 18¼ hours, by which time its epoxide value is 0.44 equivalent/kg and its viscosity at 25° C. is 26 Pa s. This mixture is Resin Solution I.

Resin Solution II

A mixture of 1,5-bis(4-glycidyloxyphenyl)penta-1,4-dien-3-one (100 parts), 2,6-di-tert.butyl-4-methylphenol (0.8 part), and 2-hydroxyethyl methacrylate (131 parts) is heated to 100° C. and a mixture of 5,5-dimethylhydantoin (30.5 parts) and tetramethylammonium chloride (0.4 part) is added portionwise over 20 minutes. The mixture is then stirred at 100° C. for a further 15 hours, by which time the mixture has an epoxide content of 0.50 equivalent/kg and a viscosity at 25° C. of 56.5 Pa s. This mixture is Resin Solution II.

Resin Solution III 1,5-Bis(4-glycidyloxyphenyl)penta-1,4-dien-3-one (100 parts) is mixed with 2,2-bis(3,5-dibromo-4-hydroxyphenyl)propane (38.2 parts), 2,2-bis(4-hydroxyphenyl)propane (27.3 parts), tetraethylammonium bromide (0.05 part) and 2-methoxyethylacrylate. This mixture is heated to 100° C. for 39 hours, by which time its epoxide content is 0.53 equivalent/kg and its viscosity is 3.4 Pa s. This mixture is Resin Solution III.

Resin Solution IV 1,5-Bis(4-hydroxyphenyl)penta-1,4-dien-3-one (58.5 parts), 1,3-diglycidyl-5-pentamethylene hydantoin (51.6 parts), 2-hydroxyethyl methacrylate (110.1 parts), and tetramethylammonium bromide (0.3 part) are mixed. This mixture is heated for 9 hours at 100° C., then a further amount of tetraethylammonium bromide (0.3 g) is added and the heating is continued for a further 6 hours, by which time the epoxide content is 0.14 equivalent/kg. The epoxide content is reduced to a negligible value by adding acrylic acid (2.5 parts) at this stage and heating for a further 1½ hours at 100° C. This mixture is Resin Solution IV.

Resin Solution V

Benzophenone tetracarboxylic acid dianhydride (692 parts) is mixed with 2-hydroxyethyl methacrylate (1117 parts), tetramethylammonium chloride (3.2 parts) and 2,6-di-t-butyl-p-cresol (2.2 parts). The mixture is heated for 5 hours at 80° C., by which time no anhydride remains. This mixture is Resin Solution V.

Resin Solution VI

Phenyl glycidyl ether (1000 parts, epoxide content 6.37 equivalents/kg) is mixed with triphenylphosphine (3 parts), and 2,6-di-tert.-butyl-4-methyl phenol (2 parts) and heated to 100° C. Over a period of 1 hour methacrylic acid (547.8 parts) is added whilst maintaining the temperature at 100° C., and the heating is continued for a further 6 hours. On cooling the epoxide content of this product is 0.84 equivalent/kg and its viscosity at 25° C. is 0.0425 Pa s. Polyvinyl cinnamate (10 parts) is dissolved in the product (10 parts) to give Resin Solution VI.

Resin VII

A mixture of an epoxy novolak resin (100 parts) having an epoxide content of 5.61 equiv. per kg. and being a polyglycidyl ether made from a phenol-formaldehyde novolak of average molecular weight 420, 2,6-di-t-butyl-p-cresol (0.2 part) and chromium III tris octanoate (0.1 part) is heated to 120° C. and cinnamic acid (83 parts) is added over a period of 1 hour. Heating is continued for a further 3½ hours at 120° C. and the mixture is then allowed to cool. The product becomes solid at room temperature and has an epoxy content of 0.16 equiv. per kg.

Resin VIII—2-acryloyloxyethoxycarbonamidobenzene

This is prepared by adding hydroxyethyl acrylate (60 parts) dropwise with stirring to a mixture of phenylisocyanate (59 parts) and dibutyl tin dilaurate (0.2 part) followed by heating at 70° C. until all of the isocyanate has reacted.

Resin IX

A mixture of an epoxy novolak resin (9.9 parts) having an epoxide content of 5.61 equiv. per kg and being a polyglycidyl ether made from a phenol-formaldehyde novolak of average molecular weight 420, 2,2-bis(4-hydroxyphenyl)propane (2.3 parts), 4-azidobenzoic acid (4.8 parts), 2,6-di-t-butyl-p-cresol (0.14 part), tetramethylammonium chloride (0.05 part) and cyclohexanone (40 parts) are heated with stirring at 120° C. for 5 hours, by which time the epoxide content is reduced to a negligible value. The cyclohexanone is then removed by distillation under reduced pressure.

EXAMPLE 1

A composition containing N-(2-acryloyloxyethyl)-dimethylmaleimide (10 parts), 1,1,1-trimethylolpropane trismethacrylate (2 parts), cumene hydroperoxide (0.3 part), N,N-dimethyl-p-toluidine (0.01 part), benzoic sulphimide (0.02 part), and 2-chlorothioxanthone (0.2 part) is applied by spin-coating to a copper plate, leaving a coating 18 μm thick. The plate is placed in an airtight container which is purged with nitrogen for 30 minutes at room temperature, after which time the coating has solidified to a tack-free film.

The film is irradiated through a negative for 15 minutes using a 5000 w metal halide lamp at a distance of 750 mm. Development in cyclohexanone gives a good image on the plate.

EXAMPLE 2

A composition is prepared containing 1-(p-(2-hydroxy-3-methacryloyloxypropoxy)phenyl)-5-phenyl-penta-1,4-dien-3-one (10.0 parts), trimethylolpropane trismethacrylate (3.0 parts), cumene hydroperoxide (0.3 part), N,N-dimethyl-p-toluidine (0.01 part), benzoic sulphimide (0.02 part), and benzil dimethyl ketal (0.2 part), the purpose of the last being to catalyse photopolymerisation of any trismethacrylate which has not already polymerised anaerobically. This liquid composition is applied by spin-coating onto a copper-clad laminate sheet, leaving a coating 22 μm thick. The plate is placed in an airtight container and nitrogen is passed in until the oxygen content of the atmosphere in the container is below 0.5% by volume.

After 30 minutes at room temperature the plate is removed; the liquid composition has solidified to a tack-free film.

The film is irradiated through a negative for 15 minutes using a 5000 w metal halide lamp at a distance of 750 mm. Development in toluene gives a good image on the plate.

EXAMPLE 3

A composition is prepared containing N-(2-acryloyloxyethyl)-dimethylmaleimide (9.0 parts), cumene hydroperoxide (0.3 part), methacrylic acid (1.0 part), N,N-dimethyl-p-toluidine (0.01 part), benzoic sulphimide (0.02 part), 2-chlorothioxanthone (0.2 part), and benzil dimethyl ketal (0.2 part). This composition is coated onto a copper-clad laminate, maintained in a nitrogen atmosphere, and irradiated as described in Example 2. Development is effected in 2% aqueous sodium hydroxide solution, giving a good image.

EXAMPLE 4

A composition is prepared containing N-(2-methacryloyloxyethyl)dimethylmaleimide (9.0 parts), tetrahydrofurfuryl methacrylate (1.0 part), cumene hydroperoxide (0.3 part), N,N-dimethyl-p-toluidine (0.01 part), benzoic sulphimide (0.02 part), 2-chlorothioxanthone (0.2 part), and benzil dimethyl ketal (0.2 part). This coating is applied to a copper-clad laminate as described in Example 2. The wet coating is then covered with a silicone-coated release paper and a vacuum (67 mm Hg) is applied between the laminate and the release paper. After 30 minutes the vacuum is released and the release paper is removed. The coating is dry and tack-free. The coating is then irradiated through a negative as described in Example 2, and a good image is developed by treatment with toluene.

EXAMPLE 5

A composition is prepared containing N-(2-methacryloyloxyethyl)dimethylmaleimide (9.0 parts), tetrahydrofurfuryl methacrylate (1.0 part), methacrylic acid (1.0 part), benzil dimethyl ketal (0.1 part), 2-chlorothioxanthone (0.1 part), cumene hydroperoxide (0.7 part), and the ketimine (2.0 parts) formed from triethylenetetramine (1 mol) and isobutyl methyl ketone (2 mol.) This composition is coated onto a copper-clad laminate as described in Example 2 and placed in an airtight chamber. The air is displaced by nitrogen at atmospheric pressure which has been moistened by passage through water warmed to 40°.

On removal from the nitrogen atmosphere after 10 minutes the coating is dry and tack-free. It is irradiated through a negative for 10 minutes using a 5000 w metal halide lamp at a distance of 750 mm. A good image is developed on treatment with 2% aqueous sodium hydroxide.

EXAMPLE 6

A composition is prepared containing Resin Solution I (10.0 parts), cumene hydroperoxide (0.3 part), N,N-dimethyl-p-toluidine (0.01 part), benzoic sulphimide (0.02 part), and benzil dimethyl ketal (0.2 part). This composition is applied to a copperclad laminate, leaving a coating 6 μm thick, and the laminate is maintained in a nitrogen atmosphere for 5 minutes, by which time the coating is tack-free. It is irradiated through a negative and under a vacuum for 10 seconds, using a 5000 w metal halide lamp at a distance of 750 mm. Development in cyclohexanone gives a good image on the plate.

EXAMPLE 7

A composition is prepared containing Resin Solution II (10 parts), cumene hydroperoxide (0.3 part), N,N-dimethyl-p-toluidine (0.01 part), and benzil dimethyl ketal (0.2 part). This composition is applied to a copperclad laminate, leaving a coating 8 μm thick. The laminate is maintained in a nitrogen atmosphere for 10 minutes, by which time the coating is tack-free. It is irradiated through a negative and under vacuum for 10 seconds, using a 5000 w metal halide lamp at a distance of 750 mm. Development in cyclohexanone gives a good image on the plate.

EXAMPLE 8

A composition is prepared containing 2,2-bis(4-(2-hydroxy-3-methacryloyloxypropoxy)phenyl)propane (60 parts), tripropyleneglycol diacrylate (20 parts), 2-hydroxyethyl methacrylate (20 parts), cumene hydroperoxide (3 parts), benzoic sulphimide (0.2 part), N,N-dimethyl-p-toluidine (0.1 part), and benzil dimethyl ketal (2 parts). This composition is applied to a copper-clad laminate using a draw bar technique, to give a coating of 25–28 μm. The laminate is then maintained in a nitrogen atmosphere for 15 minutes, by which time the coating is tack-free. It is irradiated through a negative and under a vacuum for 60 seconds, using a 5000 w metal halide lamp at a distance of 750 mm. Development in acetone gives a good image on the plate.

EXAMPLE 9

A composition is prepared containing Resin Solution III (10 parts), cumene hydroperoxide (0.3 part), N,N-dimethyl-p-toluidine (0.02 part), and benzoic sulphimide (0.04 part). This composition is applied to a copper-clad laminate, giving a coating 10–14 μm thick, which is then maintained in a nitrogen atmosphere for 20 minutes, giving a tack-free coating. It is irradiated through a negative under vacuum for 60 seconds, using a 5000 w metal halide lamp at a distance of 750 mm. Development in butyl digol gives a good image.

EXAMPLE 10

A composition is prepared containing Resin Solution IV (9 parts), Resin Solution V (1 part), cumene hydroperoxide (0.3 part), N,N-dimethyl-p-toluidine (0.01 part) and benzoic sulphimide (0.02 part). This composition is applied to a copper-clad laminate giving a coating 18–20 μm thick and the laminate is placed in a nitrogen atmosphere for 15 minutes, by which time the coating is tack-free. It is irradiated through a negative and under a vacuum for 30 seconds, using a 5000 w metal halide halide lamp at a distance of 750 mm. Development in a 2% aqueous sodium carbonate solution with brushing gives an image.

EXAMPLE 11

A composition is prepared containing Resin Solution I (100 parts), p-toluenesulfonic acid hydrazide (1 part), benzoic sulphimide (1 part) and N,N-dimethyl-p-toluidine-N-oxide (1 part). This composition is coated onto a precleaned copper-clad laminate and placed in an atmosphere of nitrogen at 45° C. for 5 minutes to give a tack-free coating 25 μm thick. The coating is irradiated through a negative for 60 seconds, using a 5000 w metal halide lamp at a distance of 750 mm. A good image is produced upon development in benzyl alcohol.

EXAMPLE 12

Resin Solution VI (20 parts) is mixed with cumene hydroperoxide (0.6 part), benzoic sulphimide (0.04 part) and N,N-dimethyl-p-toluidine (0.02 part) and applied to a copper-clad laminate leaving a coating 6 μm thick. The laminate is then placed in a nitrogen atmosphere for 15 minutes to produce a tack-free coating. It is irradiated through a negative and under vacuum for 5 minutes, using using a 5000 w metal halide lamp at a distance of 750 mm. Development in a mixture of toluene and acetone (9:1) gives a good image on the plate.

EXAMPLE 13

A mixture of an epoxide novolak resin having an epoxide content of 5.61 eq/kg and being a polyglycidyl ether made from a phenol-formaldehyde novolak of molecular weight 420 (50 parts), the tetraglycidyl ether of 1,1,2,2-tetrakis-(p-hydroxyphenyl)ethane having an epoxide content of 5.20 eq/kg (50 parts), 1,4-butanediol dimethacrylate (60 parts), cumene hydroperoxide (7 parts) bis-(4-methyl phenyl)iodonium hexafluorophosphate (2 parts), and Accelerator NL 53A, a commercial product available from Akzo Chemie U.K. Ltd., Wandsworth, London S.W.18. and described at a solution of cobalt metal (10%) in white spirit, (1 part) is applied as a coating 120–130 μm thick onto a copper-clad laminate. The coated laminate is then placed in an air-tight chamber and the air displaced by nitrogen, which is preheated to a temperature of 40° C., for a period of 5 minutes, after which the coating is dry and tack-free. It is then irradiated through a negative for 3 minutes using a 5000 w metal halide lamp at a distance of 750 mm. A good image is produced on development in acetone.

EXAMPLE 14

A mixture of Resin VII (10 parts), N,N-diethylaminoethyl acrylate (5 parts), cumene hydroperoxide (0.6 part), benzoic sulphimide (0.05 part) and Michler's ketone (0.2 part) is applied to a copper-clad laminate as a coating 15–17 μm thick. The coated laminate is placed in an air-tight chamber and the air displaced by nitrogen, which is preheated to 40° C., for 3 minutes, after which the coating is dry and tack-free. It is then irradiated through a negative for 3 minutes under a 5000 w metal halide lamp at a distance of 750 mm. A good image is developed in ethanol.

EXAMPLE 15

A mixture of Resin VII (6 parts), Resin VIII (4 parts), cumene hydroperoxide (0.5 part), benzoic sulphimide (0.05 part) and Michler's ketone (0.2 part) is applied to a copper-clad laminate as a coating 8–10 μm thick. The coated laminate is placed in an air-tight chamber and the air displaced by nitrogen, which is preheated to 40° C., for 5 minutes to give a dry, tack-free coating. It is then irradiated through a negative for 1 minute using a 5000 w metal halide lamp at a distance of 750 mm. A good image is developed in ethanolacetone (19:1).

EXAMPLE 16

A mixture of Resin IX (80 parts), 2-cyanoethyl acrylate (20 parts) cumene hydroperoxide (5 parts), and iron naphthenate (6% solution in white spirit) (0.1 part) is applied as a coating 10–12 μm thick to a copper-clad laminate. The coated laminate is then placed in an air-tight chamber and the air displaced by nitrogen, which is preheated to 40° C., for 10 minutes, after which the coating is tack-free. It is then irradiated through a negative for 2 minutes using 5000 w metal halide lamp at a distance of 750 mm. A good image is developed in toluene.

What is claimed is:

1. A process for the production of an image which comprises
   (1) maintaining in a substantially oxygen-free environment a layer, supported on a substrate, of a liquid composition containing
      (a) an anaerobically polymerisable material and
      (b) a photopolymerisable material for a sufficient period for the layer of liquid composition to solidify,
   (2) exposing imagewise to actinic radiation the solidified layer, and
   (3) treating the layer with a developer to remove those parts of the layer which have not been exposed to the actinic radiation in (2).

2. A process as claimed in claim 1, in which the anaerobically polymerisable material (a) comprises
   (i) an ester of an acrylic acid, optionally containing free acidic or amino groups,
   (ii) a polymerisation initiator for (i), and, optionally,
   (iii) an accelerator for the polymerisation of (i).

3. A process as claimed in claim 2, in which the ester (i) is selected from esters of mono- and polyhydric alcohols, esters of hydroxycarboxylic, hydroxysulfonic, and hydroxyphosphoric acids, esters of hydroxyalkylamines and hydroxyalkylnitriles, acrylic ester-urethanes and acrylic ester-ureides.

4. A process as claimed in claim 3, in which the ester has only one acrylic ester group per molecule.

5. A process as claimed in claim 4, in which the acrylic ester is selected from acrylates and methacrylates of ethylene glycol, 2-methoxyethanol, tetrahydrofurfuryl alcohol, N,N-diethylaminoethanol and 2-cyanoethanol, 2-hydroxy-3-acryloyloxypropoxybenzene, 2-hydroxy-3-methacryloyloxypropoxybenzene, 2-acryloyloxyethoxycarbonamidobenzene and 2-methacryloyloxyethoxycarbonamidobenzene.

6. A process as claimed in claim 2, in which the polymerisation initiator (ii) is an organic hydroperoxide of formula $R^{10}OOH$, where $R^{10}$ is a monovalent organic radical containing up to 18 carbon atoms, hydrogen peroxide, an organic peroxide, or a mixture of an organic amine oxide and a sulphonic acid hydrazide.

7. A process as claimed in claim 2, in which the anerobically polymerisable material (a) contains an accelerator (iii) which is an aliphatic amine having at least two primary aliphatic amino groups, a ketimine thereof, a polyisocyanate, an aldimine, a tertiary amine, an imide, a sulfimide, an amide, a thioamide, a thiazole, ascorbic acid, an organic phosphite, a quaternary ammonium salt, a quaternary ammonium base, a salt of a transition metal, a thiourea, or a polymercaptan.

8. A process as claimed in claim 1, in which the photopolymerisable material (b) is one in which polymerisation is effected by irradiation activating photosensitive groups directly.

9. A process as claimed in claim 8, in which the photopolymerisable material (b) has at least two groups which are azido, coumarin, stilbene, maleimido, pyridinone, chalcone, propenone, pentadienone, or acrylic ester groups which are substituted in their 3-position by a group having ethylenic unsaturation or aromaticity in conjugation with an ethylenic double bond of the acrylic group.

10. A process as claimed in claim 9, in which the photopolymerisable material (b) contains at least two groups of formula

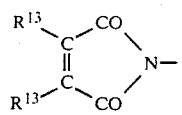

VII where Ar denotes a mononuclear or dinuclear divalent aromatic radical containing from 6 to 14 carbon atoms.

11. A process as claimed in claim 9, in which the photopolymerisable material (b) contains at least two groups of formula

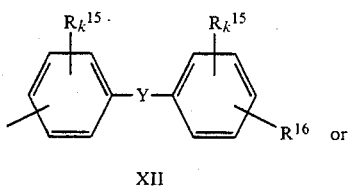

X where each $R^{13}$ is an alkyl group of 1 to 4 carbon atoms, a chlorine atom, or a phenyl group.

12. A process as claimed in claim 9, in which the photopolymerisable material (b) contains at least two groups of formula

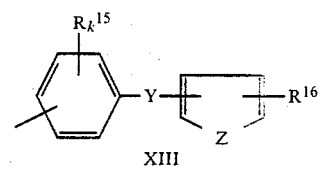

XII

XIII where
each $R^{15}$ is a halogen atom, or an alkyl, cycloalkyl, alkenyl, cycloalkenyl, alkoxy, cycloalkoxy, alkenoxy, cycloalkenoxy, carbalkoxy, carbocycloalkoxy, carbalkenoxy, or carbocycloalkenoxy group, such organic groups containing 1 to 9 carbon atoms, or is a nitro group, or a carboxyl, sulfonic, or phosphoric acid group in the form of a salt,
k is zero or an integer of 1 to 4,
$R^{16}$ represents a valency bond or a hydrogen atom,
Y represents a grouping of formula

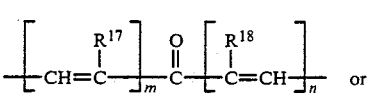

XIV

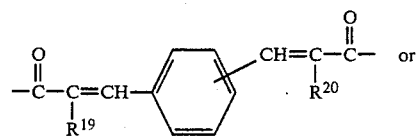

XV

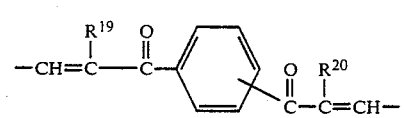

XVI $R^{17}$ and $R^{18}$ are each individually a hydrogen atom, an alkyl group, or an aryl group, or $R^{17}$ and $R^{18}$ conjointly denote a polymethylene chain of 2 to 4 methylene groups, $R^{19}$ and $R^{20}$ are each a hydrogen atom, an alkyl group, or an aryl group, m and n are each zero, 1, or 2, with the proviso that they are not both zero, and Z is an oxygen or sulphur atom.

13. A process as claimed in claim 9, in which the photopolymerisable material (b) contains at least two groups of formula $$R^{21}CH=C(R^1)COO- \qquad XVII$$

where $R^{21}$ is an aliphatic or mononuclear aromatic, araliphatic, or heterocyclic group which has ethylenic unsaturation or aromaticity in conjugation with the ethylenic double bond shown and $R^1$ denotes —H, —Cl, —CH$_3$, or C$_2$H$_5$.

14. A process as claimed in claim 1, in which the photopolymerisable material (b) is one in which irradiation activates a suitable photoinitiator molecule which then activates polymerisable groups.

15. A process as claimed in claim 14, in which the photopolymerisable material (b) comprises an epoxide resin, phenolic resin, urea-formaldehyde resin, cyclic ether, cyclic ester, cyclic sulphide, cyclic amine or organosilicon cyclic, in combination with a radiation-sensitive aromatic 'onium salt.

16. A process as claimed in claim 1, in which the liquid composition comprises a dual-functional substance having both anaerobically polymerisable and photopolymerisable groups which is present as both (a) and (b).

17. A process as claimed in claim 16, in which the liquid composition comprises a mixture of the dual-functional substance with an anaerobically polymerisable substance, an exclusively photopolymerisable substance, or both an anaerobically polymerisable substance and an exclusively photopolymerisable substance.

18. A process as claimed in claim 16, in which the dual-functional substance contains one or more acrylic ester groups which polymerise under anaerobic conditions and also one or more photosensitive groups which are azido, coumarin, stilbene, maleimido, pyridinone, chalcone, propenone or pentadienone groups, or acrylic ester groups which are substituted in their 3-position by a group having ethylenic unsaturation or aromaticity in conjugation with an ethylenic double bond of the acrylic ester group.

19. A process as claimed in claim 16, in which the dual-functional substance contains one or more acrylic ester groups which polymerise under anaerobic conditions and one or more groups which polymerise when activated by an irradiated molecule.

20. A process as claimed in claim 1, in which the substantially oxygen-free environment is produced by evacuation or by replacement with moist or dry nitrogen.

* * * * *